US008199858B2

(12) United States Patent
Kurooka et al.

(10) Patent No.: US 8,199,858 B2
(45) Date of Patent: Jun. 12, 2012

(54) OOB (OUT OF BAND) DETECTION CIRCUIT AND SERIAL ATA SYSTEM

(75) Inventors: Kazuaki Kurooka, Tokyo (JP); Kenichi Shimizu, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 775 days.

(21) Appl. No.: 12/329,578

(22) Filed: Dec. 6, 2008

(65) Prior Publication Data

US 2009/0146721 A1   Jun. 11, 2009

(30) Foreign Application Priority Data

Dec. 7, 2007 (JP) ................................. 2007-316547

(51) Int. Cl.
*H03K 9/00* (2006.01)
(52) U.S. Cl. ........ 375/316; 375/340; 375/257; 375/224; 375/242; 375/243; 375/244; 375/245; 714/716; 714/47; 327/74; 327/80; 327/50; 327/51; 327/52; 327/56; 327/77
(58) Field of Classification Search .................. 375/340, 375/316, 257, 224, 242, 243, 244, 245; 714/716, 714/47; 327/74, 80, 50, 51, 52, 56, 77
See application file for complete search history.

(56) References Cited

U.S. PATENT DOCUMENTS

| 7,039,064 | B1 * | 5/2006 | Paulson et al. ................. 370/459 |
| 7,280,302 | B1 * | 10/2007 | Masiewicz ....................... 360/69 |
| 7,282,965 | B2 * | 10/2007 | Hatooka et al. .................. 327/80 |
| 2005/0024083 | A1 | 2/2005 | Kitamura et al. |
| 2005/0047499 | A1 * | 3/2005 | Wood .............................. 375/224 |
| 2007/0116134 | A1 * | 5/2007 | Schoenborn ................... 375/257 |
| 2008/0304509 | A1 * | 12/2008 | Xu et al. ........................ 370/459 |
| 2009/0083587 | A1 * | 3/2009 | Ng et al. ......................... 714/47 |

FOREIGN PATENT DOCUMENTS

| JP | H6-334609 | 12/1994 |
| JP | 2005-50257 A | 2/2005 |
| JP | 2007-004587 A | 1/2007 |
| JP | 2007-97176 A | 4/2007 |

OTHER PUBLICATIONS

Office Action from Japanese Patent Application No. 2007-316547 (and English translation).

* cited by examiner

*Primary Examiner* — Siu Lee
(74) *Attorney, Agent, or Firm* — Miles & Stockbridge P.C.

(57) ABSTRACT

The present invention provides an OOB detection circuit capable of making accurate signal determination even in the case where a characteristic fluctuation occurs in an analog circuit, thereby preventing deterioration in the yield of a product. To an amplitude determining circuit, a characteristic adjustment register for changing setting of an amplitude threshold adjustment mechanism for distinguishing a burst and a squelch from each other provided for the amplitude determining circuit is coupled. The characteristic adjustment register is controlled by a self determination circuit. An output of the amplitude determination circuit is supplied to a time determining circuit and also to the self determination circuit. On the basis of the output of the amplitude determining circuit, the self determination circuit controls the characteristic adjustment register.

5 Claims, 9 Drawing Sheets

FIG. 1
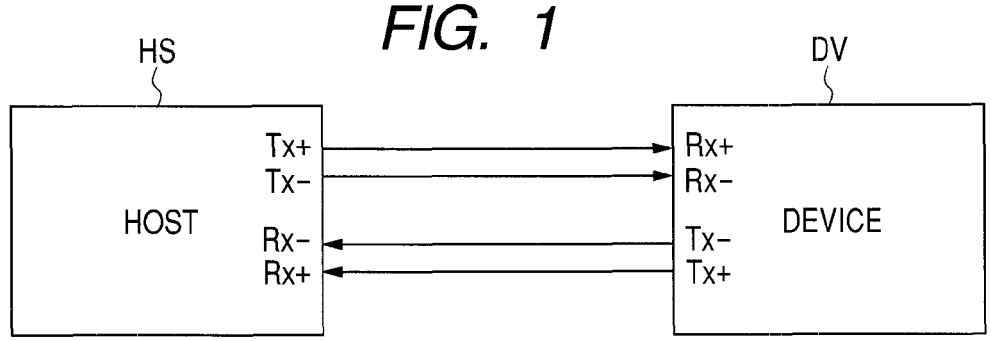
FIG. 2
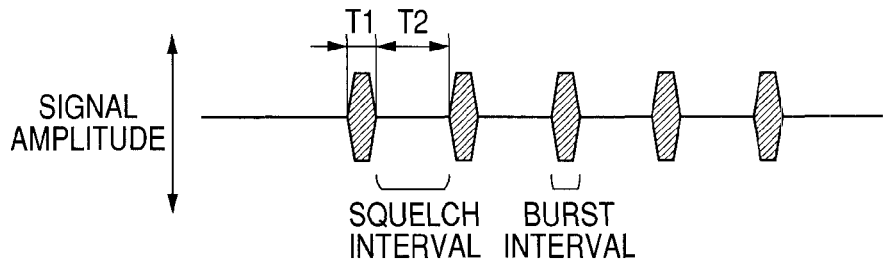
FIG. 3
|  | T1 TIME | T2 TIME |
|---|---|---|
| COMWAKE | 106.7ns | 106.7ns |
| COMINIT/COMRESET | 106.7ns | 320ns |
FIG. 4
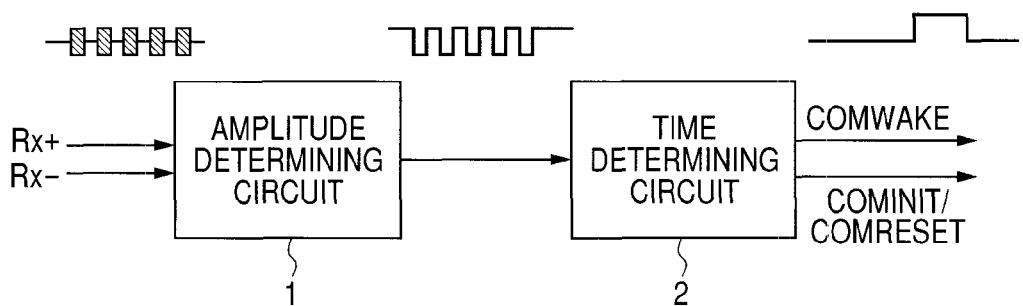

FIG. 5

| AMPLITUDE RANGE WHICH HAS TO BE DETERMINED AS BURST | 200 mV ppd OR HIGHER |
|---|---|
| AMPLITUDE RANGE WHICH MAY BE DETERMINED AS BURST OR SQUELCH | 75 mV ppd OR HIGHER AND LESS THAN 200 mV ppd |
| AMPLITUDE RANGE WHICH HAS TO BE DETERMINED AS SQUELCH | 75 mV ppd OR LOWER |

FIG. 6

| | | |
|---|---|---|
| SQUELCH TIME STANDARD OF COMWAKE | SQUELCH TIME WHICH MAY BE DETERMINED AS COMWAKE | 35 ns OR LONGER AND LESS THAN 175 ns |
| | SQUELCH TIME WHICH HAS TO BE DETERMINED AS COMWAKE | 101.3 ns OR LONGER AND LESS THAN 112 ns |
| | SQUELCH TIME WHICH SHOULD NOT BE DETERMINED AS COMWAKE | LESS THAN 35 ns AND 175 ns OR LONGER |
| SQUELCH TIME STANDARD OF COMINIT/COMRESET | SQUELCH TIME WHICH MAY BE DETERMINED AS COMINIT/COMRESET | 175 ns OR LONGER AND LESS THAN 525 ns |
| | SQUELCH TIME WHICH SHOULD BE DETERMINED AS COMINIT/COMRESET | 304 ns OR LONGER AND LESS THAN 336 ns |
| | SQUELCH TIME WHICH SHOULD NOT BE DETERMINED AS COMINIT/COMRESET | LESS THAN 175 ns AND 525 ns OR LONGER |

OOB (OUT OF BAND) DETECTION CIRCUIT AND SERIAL ATA SYSTEM

CROSS-REFERENCE TO RELATED APPLICATIONS

The disclosure of Japanese Patent Application No. 2007-316547 filed on Dec. 7, 2007 including the specification, drawings and abstract is incorporated herein by reference in its entirety.

BACKGROUND OF THE INVENTION

The present invention relates to an OOB (Out Of Band) detection circuit in a host and a device, of a system using serial advanced technology attachment (SATA).

In serial advanced technology attachment (hereinbelow, called SATA) as a communication standard between a host of a computer and a device, when a host and a device recover from a power management (called PM mode or PM state) state in which power consumption is returned or make a reset, a specific pattern (OOB pattern) is transmitted from either the host or device to the other side. The receiver has to recognize that the transmitted pattern is an OOB pattern.

An OOB signal is detected by detecting a burst period and a space period (squelch period). The configuration of a conventional OOB detection circuit is disclosed in FIG. 7 of Japanese Unexamined Patent Publication No. 2007-4587 (patent document 1).

SUMMARY OF THE INVENTION

As described in the patent document 1, an OOB signal detection circuit is configured as an analog circuit. There is a case such that characteristics fluctuate due to variations in wafer processes, temperature, and power source voltage, and the analog circuit does not satisfy standards for signal determination which is predetermined by SATA. It causes deterioration in the yield of products.

The present invention is achieved to solve such a problem and an object of the invention is to provide an OOB detection circuit capable of performing accurate signal detection, and preventing deterioration in the yield of products.

In a first embodiment of the present invention, an OOB detection circuit has therein a self adjustment mechanism including an adjustment mechanism for adjusting characteristics of an amplitude determining circuit and a time determining circuit, and a feedback mechanism for detecting outputs of the amplitude determining circuit and the time determining circuit and controlling the adjustment mechanism.

According to the embodiment, even in the case where a characteristic fluctuation occurs in the amplitude determining circuit and the time determining circuit as analog circuits, a threshold and response time in which the fluctuation is absorbed by the feedback control can be set by the self adjustment mechanism. Thus, the OOB detection circuit capable of making accurate signal determination and preventing deterioration in the yield of products can be obtained.

BRIEF DESCRIPTION OF THE DRAWINGS

FIG. 1 is a diagram showing a connection relation between a host and a device.

FIG. 2 is a diagram showing signal waveforms of an OOB pattern.

FIG. 3 is a diagram showing specification of time of a squelch interval of an OOB pattern.

FIG. 4 is a block diagram showing the configuration of an OOB detection circuit.

FIG. 5 is a diagram showing specification related to signal amplitude of the OOB detection circuit.

FIG. 6 is a diagram showing specification of time of the squelch interval of the OOB detection circuit.

DETAILED DESCRIPTION OF THE PREFERRED EMBODIMENTS

Description of Background Art

Figure 7:
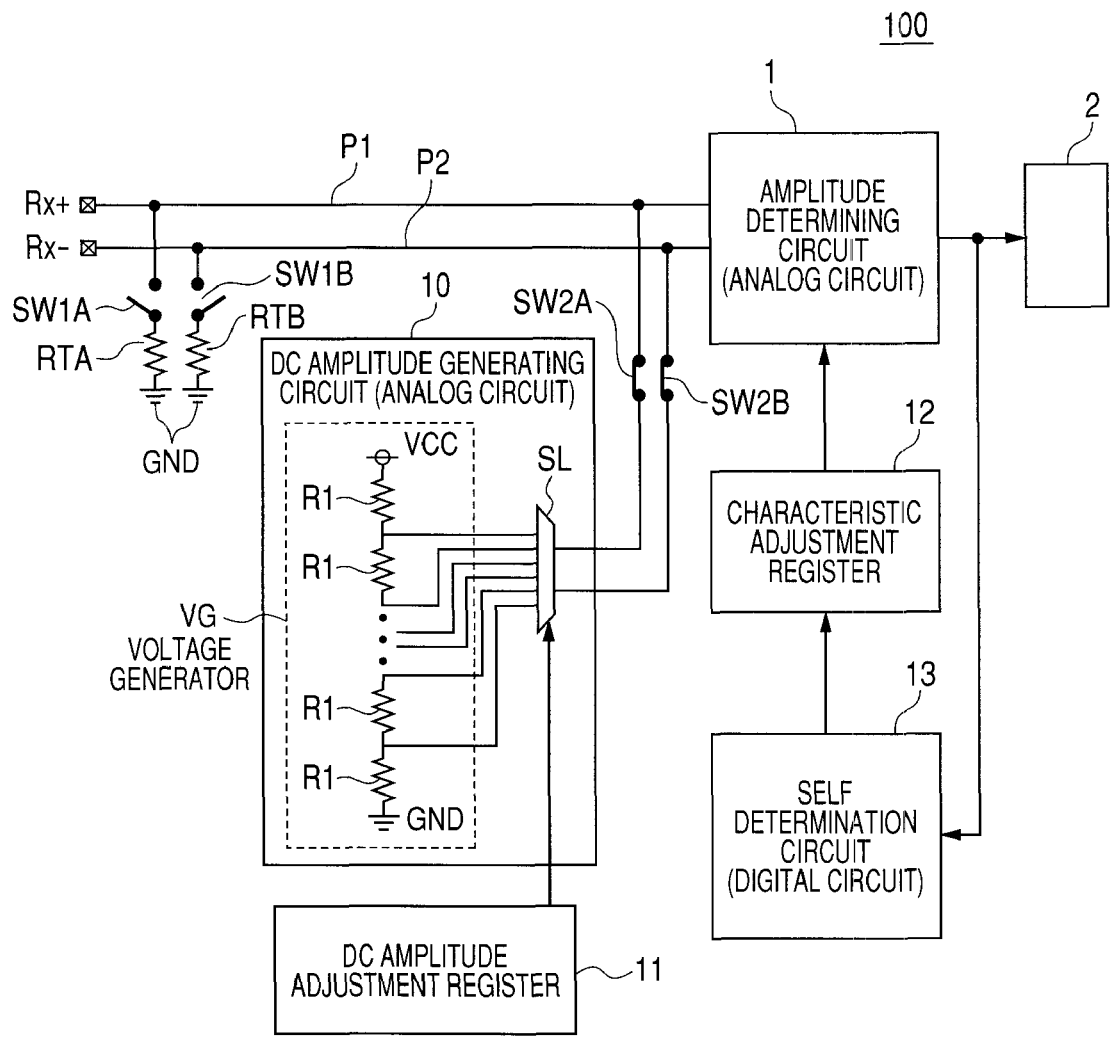
FIG. 7 is a block diagram showing the configuration of an amplitude determining circuit having a self adjustment mechanism of a first embodiment of the present invention.

Prior to explanation of the present invention, the background art on detection of an OOB signal in SATA will be described with reference to FIGS. 1 to 6.

FIG. 1 is a diagram showing a connection relation between a host HS and a device DV and schematically shows a state where an OOB pattern is output from the host HS to the device DV. The host HS corresponds to a mother board of a computer or the like and the device DV corresponds to a hardware disk drive (HDD) or a DVD (digital versatile disc) drive.

The SATA performs communication of a differential signal of ±. Each of the host HS and the device DV has four ports of a Tx+ port, a Tx− port, an Rx+ port, and an Rx− port. The Tx+ port and the Tx− port are transmission-side ports, and the Rx+ port and the Rx− port are reception-side ports.

FIG. 2 is a diagram showing an OOB pattern in which a squelch interval (time T2) in which the amplitude of the differential signal is small and a burst interval (time T1) in which the amplitude is large are repeated alternately.

FIG. 3 shows the standards of the times T1 and T2 of the burst interval and the squelch interval for each of various OOB patterns.

There are three OOB patterns COMWAKE, COMINIT, and COMRESET. When reset from a PM mode is desired, COMWAKE is output from the host or device to the other side. In the case of hardware reset is desired from the device to the host, COMINIT is output. When the host requires resetting the hardware of the device, COMREST is output.

As shown in FIG. 3, in the case of COMWAKE, each of the times T1 and T2 is 106.7 ns. In COMINIT and COMRESET, the time T1 is 106.7 ns, and the time T2 is 320 ns.

FIG. 4 shows the configuration of an OOB detection circuit for recognizing the OOB pattern on the reception side. The OOB detection circuit has an amplitude determining circuit 1 for determining a squelch interval and a burst interval and a time determining circuit 2 for determining time of the squelch interval.

As shown in FIG. 4, an OOB pattern is input to the amplitude determining circuit 1 via the Rx+ port and the Rx− port. After performing the amplitude determination, through the time determining circuit 2, any of COMWAKE, COMINIT, and COMRESET is determined.

In the amplitude determining circuit 1 and the time determining circuit 2, standard values for determining the OOB patterns exist. FIGS. 5 and 6 show the standard values.

As shown in FIG. 5, the amplitude range which has to be detected as a burst is 200 mV ppd or higher. The amplitude range which may be determined as burst or squelch is 75 mV or higher and less than 200 mV. The amplitude range which has to be determined as squelch is less than 75 mV ppd. "ppd" denotes perk to peak differential which is a unit of the signal amplitude of a differential signal.

As shown in FIG. 6, in the squelch time standard of COMWAKE, the squelch time which may be determined as COMWAKE is 35 nm or longer and less than 175 ns. The squelch time which has to be determined as COMWAKE is 101.3 ns or longer and less than 112 ns. The squelch time which should not be determined as COMWAKE is less than 35 ns and 175 ns or longer.

In the squelch time standards of COMINIT and COMRESET, the squelch time which may be determined as COMINIT/COMRESET is 175 ns or longer and less than 525 ns. The squelch time which has to be determined as COMINIT/COMRESET is 304 ns or longer and less than 336 ns. The squelch time which should not be determined as COMINIT/COMRESET is less than 175 ns and 525 ns or longer.

In the device DV, since there is a case that the reference clock has to be also stopped in the PM state, each of the amplitude determining circuit 1 and the time determining circuit 2 has to be configured by an analog circuit.

Technical Idea of the Invention

As described above, each of the amplitude determining circuit 1 and the time determining circuit 2 has to be formed by an analog circuit which does not require a reference clock. There is the case that the standard for signal determination determined by SATA is not satisfied due to the characteristic fluctuations. The present invention is based on the technical idea of providing an adjustment mechanism (hereinbelow, called adjustment register) for adjusting the circuit characteristics of the amplitude determining circuit 1 and the time determining circuit 2 in the OOB detection circuit and also providing, in the circuit, a feedback mechanism of controlling the adjustment mechanism on the basis of the result of the detection, thereby automatically adjusting an adjustment register so that the circuit characteristic fluctuations satisfy the standards. The embodiments will be described below.

A. First Embodiment

A-1. Self Adjustment Mechanism of Amplitude Determining Circuit

FIG. 7 is a block diagram showing the configuration of an OOB detection circuit 100 as a first embodiment of the present invention and, particularly showing a self adjustment mechanism of the amplitude determining circuit 1.

As shown in FIG. 7, the Rx+ port and the Rx− port are coupled to the amplitude determining circuit 1 via signal paths P1 and P2, respectively. Between the signal path P1 and the ground GND, a switch SW1A and a termination resistor RTA are interposed. Between the signal path P2 and the ground GND, a switch SW1B and a termination resistor RTB are interposed.

The signal paths P1 and P2 are coupled to a DC amplitude generation circuit 10 via switches SW2A and SW2B, respectively.

The DC amplitude generation circuit 10 has a voltage generator VG for generating various voltages by dividing the voltage between the power source VCC and the ground GND by a plurality of resistors R1, and a selector switch SL for selectively outputting the voltages generated by the voltage generator VG to either the signal path P1 or P2. The setting of the selector switch SL is made by data stored in a DC amplitude adjusting register 11.

To the amplitude determining circuit 1, a characteristic adjustment register 12 (adjusting mechanism) for changing the settings of an amplitude threshold adjusting mechanism for distinguishing the burst and squelch from each other, which is provided for the amplitude determining circuit 1 is coupled. Specifically, the amplitude threshold adjusting mechanism adjusts the threshold of amplitude determination by changing a DC reference voltage to be compared with the amplitude of a signal input from the Rx+ port and the Rx− ports by a switch. Setting data of the switch is stored in the characteristic adjustment register 12. The characteristic adjustment register 12 is controlled by a self determination circuit 13 (feedback mechanism) as a digital circuit.

An output of the amplitude determining circuit 1 is supplied to the time determining circuit 2 and also to the self determination circuit 13. The self determination circuit 13 controls the characteristic adjustment register 12 on the basis of an output of the amplitude determining circuit 1.

The operation will now be described. In the normal SATA communication operation, the switches SW1A and SW1B are in the on state, and the switches SW2A and SW2B are in the off state, so that an output of the DC amplitude generating circuit 10 is not supplied to the amplitude determining circuit 1.

At the time of performing self adjustment, the switches SW1A and SW1B are set to the off state and the switches SW2A and SW2B are set to the on state, and in place of signals from the Rx+ port and Rx− port, a DC voltage output from the DC amplitude generating circuit 10 is input as a differential voltage to the amplitude determining circuit 1.

The OOB pattern which is input in the normal operation is a data pattern in which the burst interval becomes high and low at the speed of 1.5 Gbps. A simple DC signal is used for self adjustment. For example, 100 mV is output to the Rx+ side and 0 mV is output to the Rx− side, so that there is the difference between the threshold of the burst and squelch determined by the amplitude determination circuit 1 and the threshold for determining whether the amplitude of a DC signal is large or small.

Specifically, in the case of setting the threshold of the burst and squelch in the amplitude determining circuit 1 to 125 mV ppd, the threshold (mV ppd) at the DC amplitude is evaluated in advance, and the DC amplitude adjustment register 11 is set so as to obtain the DC amplitude. In the normal case, when the threshold of the burst and squelch is set to 125 mV ppd, the threshold for determining whether the amplitude of a DC signal is large or small is about 75 mV ppd.

The amplitude determining circuit 1 outputs, for example, a high-level signal when the input amplitude is smaller than the threshold, and outputs a low-level signal when the input amplitude is larger than the threshold. At the time of performing self adjustment, in a state where the DC amplitude adjustment register 11 is set so that the amplitude of the DC voltage output from the DC amplitude generating circuit 10 becomes, for example, 75 mV ppd, the switches SW1A and SW1B are turned off and the switches SW2A and SW2B are turned on, the DC voltage is input to the amplitude determining circuit 1.

The self determination circuit 13 controls the characteristic adjustment register 12 to set the determination threshold of the DC signal in the amplitude determining circuit 1 to the lowest. The self determination circuit 13 receives an output of the amplitude determining circuit 1 and determines the level (high or low) of the output.

Since the determination threshold is initially set to the lowest, the output of the amplitude determining circuit 1 is at the low level. The self determining circuit 13 increases the setting of the characteristic adjustment register 12 step by step until an output of the amplitude determining circuit 1 becomes the high level, and stops changing the setting with a register value by which the output of the amplitude determining circuit 1 changes from the low level to the high level.

The determination threshold of the DC signal in the amplitude determining circuit 1 set by the register value at this time is an actual threshold in the case where the threshold of burst and squelch is set to 125 mV ppd. Since the value is a value in which the characteristic fluctuations in the amplitude determining circuit 1 are absorbed, the register value of the characteristic adjustment register 12 at this time is used in the normal communication operation. In such a manner, the threshold of the burst and squelch can be set to a value around 125 mV ppd as a target value.

As described above, the amplitude generating circuit 10 for generating a DC signal having an arbitrary amplitude from a DC voltage is provided in the OOB detection circuit 100. By inputting the generated DC signal as a test signal to the amplitude determining circuit 1 and adjusting a determination threshold by feedback operation, even in the case where the circuit characteristics of the amplitude determining circuit 1 fluctuate, a threshold in which the fluctuations are absorbed can be obtained.

The example of setting the set value of the characteristic adjustment register 12 so that the determination threshold of the DC signal becomes the lowest and increasing the set value of the characteristic adjustment register 12 step by step has been described. The set value of the characteristic adjustment register 12 may be also set so that the determination threshold of the DC signal becomes the maximum, and may be decreases step by step. The set value of the characteristic adjustment register 12 may be set so that the determination threshold of the DC signal becomes an intermediate value between the maximum and minimum values, and may be increased or decreased step by step.

A-2. Self Adjustment Mechanism of Time Determining Circuit

Figure 8:
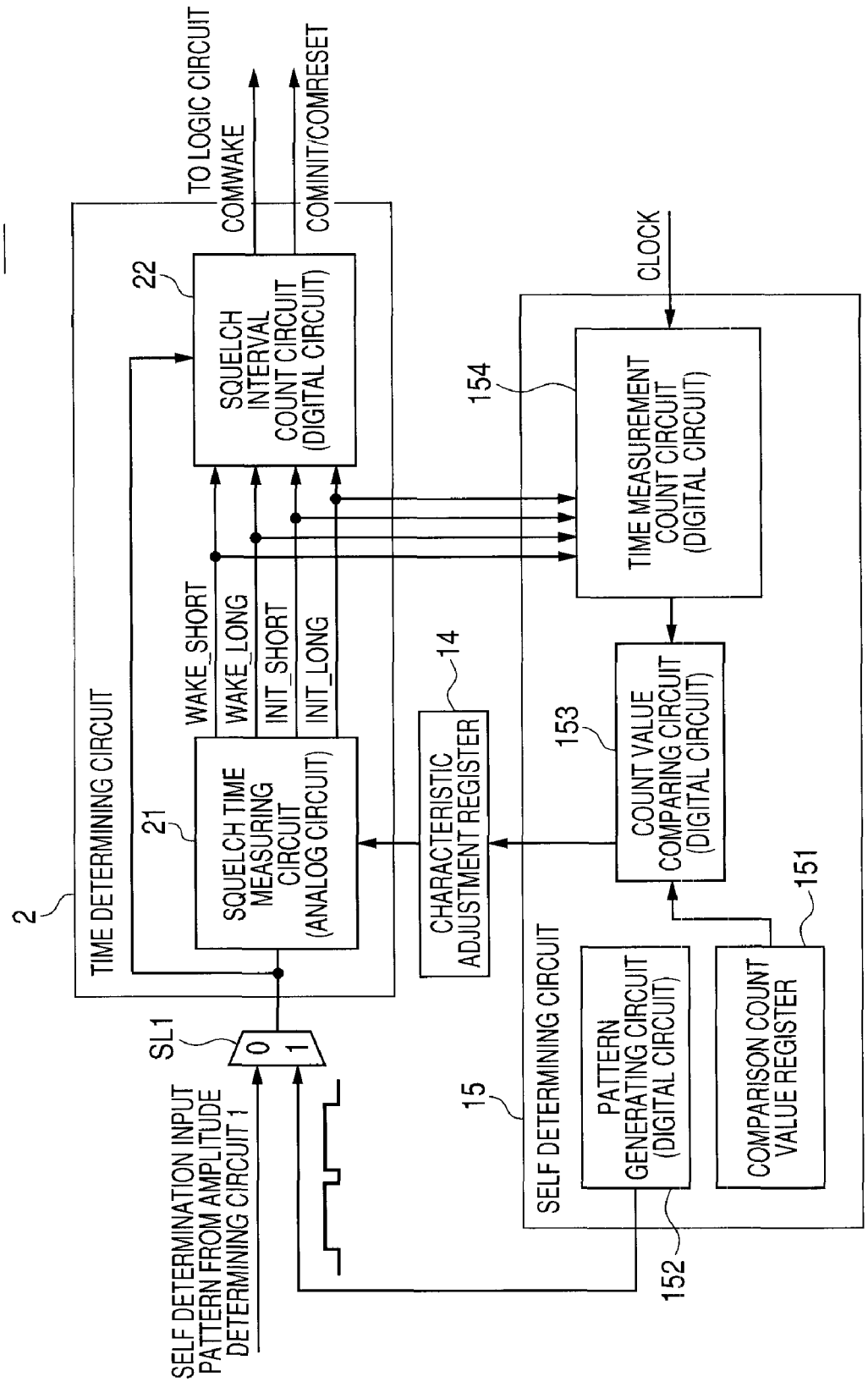
FIG. 8 is a block diagram showing the configuration of a time determining circuit having the self adjustment mechanism of the first embodiment of the invention.

FIG. 8 is a block diagram showing the self adjustment mechanism of the time determining circuit 2 in the OOB detection circuit 100 according to the present invention.

As shown in FIG. 8, an output signal from the amplitude determining circuit 1 is supplied to the time determining circuit 2 via the input selector SL1. The time determining circuit 2 has therein a squelch time measuring circuit 21 configured by an analog circuit and a squelch interval count circuit 22 as a digital circuit.

The squelch time measuring circuit 21 receives an output signal from the amplitude determining circuit 1, sets any of a WAKE_SHORT signal, a WAKE_LONG signal, an INIT_SHORT signal, and an INIT_LONG signal to the high level, and supplies the resultant signal to the squelch interval count circuit 22 and also to a time measurement count circuit 154 of the self determining circuit 15 (feedback mechanism). Response time in the squelch time measuring circuit 21 can be adjusted by, for example, setting so that a resistance value of a resistor that specifies time constant of an internal RC circuit or a capacitance value of a capacitor can be changed by changing the set value of a characteristic adjustment register 14 (adjusting mechanism).

The squelch interval count circuit 22 is a digital circuit for counting that the squelch interval of specific time is input three times or more, determines the signal indicating that the squelch interval was input three times or more as any of COMWAKE, COMINIT, and COMRESET, and supplies the determined signal to a predetermined logic circuit. To the squelch interval count circuit 22, an output of the input selector SL1 is directly supplied.

The self determining circuit 15 has: the time measurement count circuit 154 for receiving the WAKE_SHORT signal, the WAKE_LONG signal, the INIT_SHORT signal, and the INIT_LONG signal and measuring the low period in each of the signals by using a clock; a count value comparing circuit 153 for comparing a count value of the time measurement count circuit 154 and a comparison count value stored in a comparison count value register 151; and a pattern generating circuit 152 for generating a self determination input pattern (pulse pattern). The self determination input pattern output from the pattern generating circuit 152 is supplied to the input selector SL1 but is not selected in the normal operation.

The value of the characteristic adjustment register is set on the basis of a comparison result of the count value comparing circuit 153.

The operation will now be described. The OOB detection circuit 100 has to determine an OOB pattern input from the Rx+ port and the Rx– port to be any of COMWAKE, COMINIT, and COMRESET. A specification is set for each of the shorter squelch interval and the longer squelch interval in a pattern to be determined.

Specifically, in the OOB pattern, as described with reference to FIG. 6, in the case of COMWAKE, the threshold of the squelch time for determining that the input pattern is COMWAKE has to be 35 ns or longer and less than 101.3 ns on the shorter side, and has to be 112 ns or longer and less than 175 ns on the longer side.

In the case where the WAKE_SHORT signal output from the squelch time measuring circuit 21 is at the low level, it expresses that the squelch time has not reached the thresholds on the shorter side. In the case where the WAKE_SHORT signal is at the high level, it expresses that the squelch time exceeds the threshold value on the shorter time. Therefore, the WAKE_SHORT signal is a signal which should become the high level within time which is 35 ns or longer and less than 101.3 ns since the squelch interval starts (since the input becomes the high level).

When the WAKE_LONG signal is at the low level, it shows that squelch time has not reached the threshold on the longer side. When the WAKE_LONG signal becomes the high level, it shows that the squelch time exceeds the threshold on the longer side. Therefore, the WAKE_LONG signal is a signal which should becomes the high level after 112 ns and before 175 ns since the squelch starts.

Therefore, in the case where the WAKE_SHORT signal is at the high level and the WAKE_LONG signal is at the low level, the input pattern is COMWAKE.

The INIT_SHORT signal and the INIT_LONG signal output from the squelch time measuring circuit 21 are used for determining COMINIT and COMRESET. The threshold value on the short side of the squelch time for determining whether an input pattern is COMINIT/COMRESET or not has to be 175 ns or longer and less than 304 ns. The threshold value on the long side has to be 336 ns or longer and less than 525 ns.

The INIT_SHORT signal at the low level expresses that the squelch time has not reached the threshold on the short side. The INIT_SHORT signal at the high level expresses that the squelch time exceeds the threshold on the short side. Therefore, the INIT_SHORT signal is a signal which should become the high level after 175 ns and before 304 ns since the squelch interval starts (since the input signal becomes high).

The INIT_LONG signal at the low level expresses that the squelch time has not reached the threshold on the long side. The INIT_LONG signal at the high level expresses that the squelch time exceeds the threshold on the long side. Therefore, the INIT_LONG signal is a signal which should become the high level after 336 ns and before 525 ns since the squelch starts.

Therefore, in the case where the INIT_SHORT signal is at the high level and the INIT_LONG signal is at the low level, it expresses that the input pattern is COMINIT or COMRESET.

Since the squelch time measuring circuit 21 is an analog circuit, the operation may fluctuate according to process, temperature, and voltage, and there is a case that all of the signals do not lie in the standard. The configuration of absorbing the influence of fluctuations in the circuit characteristics is the self adjusting mechanism.

In the case of performing the self adjustment, an input pattern for self determination generated by the pattern generating circuit 152 in the self determining circuit 15 is selected by the input selector SL1 and input to the squelch time measuring circuit 21.

Figure 9:
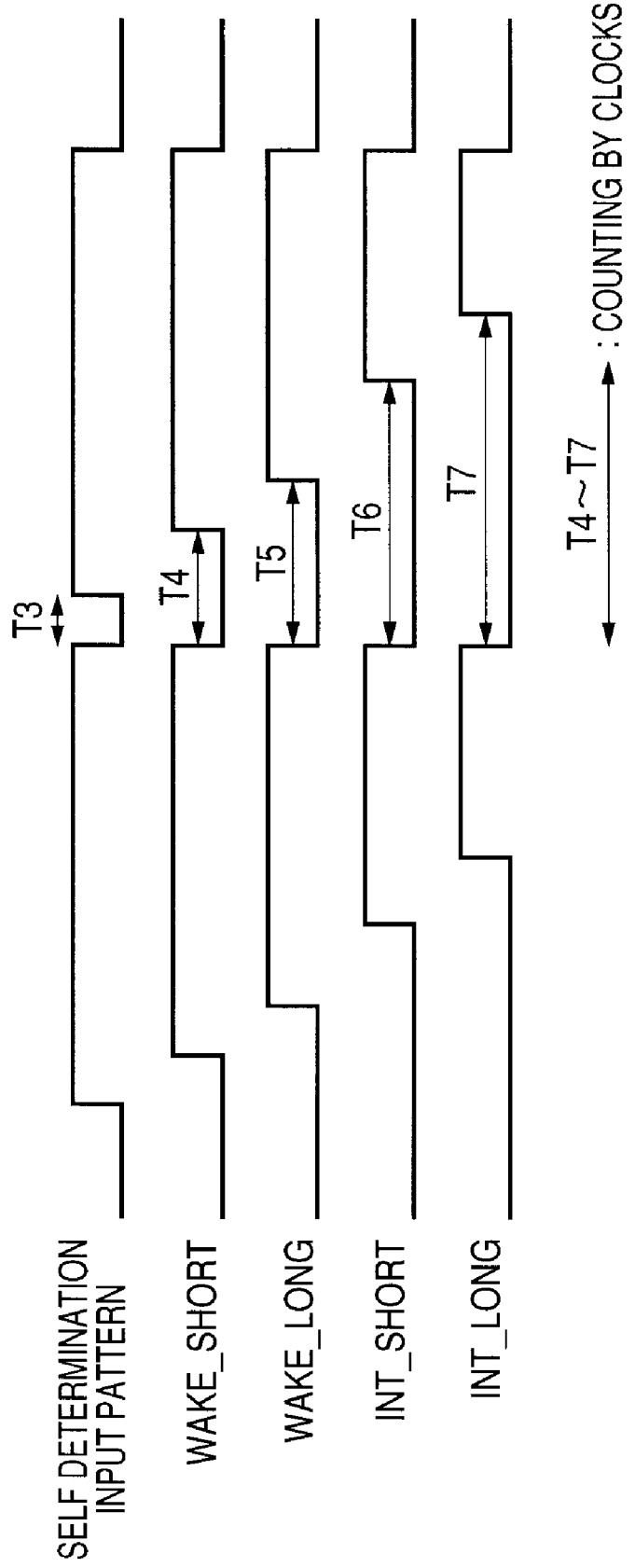
FIG. 9 is a diagram showing signal waveforms of the time determining circuit having the self adjustment mechanism of the first embodiment of the invention.

FIG. 9 shows an example of waveforms of the input pattern for self determination and four kinds of signals output from the squelch time measuring circuit 21.

In FIG. 9, the input pattern for self determination is a pattern in which the period of known time T3 (first period) is at the low level. The WAKE_SHORT signal has a pattern in which the period of time T4 (second period) is at the low level. The WAKE_LONG signal has a pattern in which the period of time T5 (second period) is at the low level. The INIT_SHORT signal has a pattern in which the period of time T6 (second period) is at the low level. The INIT_LONG signal has a pattern in which the period of time T7 (second period) is at the low level. The time T3 is the shortest, and the time T7 is the longest. In the above example, the times T3 to T7 show the period in which the potential is at the low level. Alternatively, the times T3 to T7 may show the period of the high level.

The time measuring count circuit counts the times T4 to T7 shown in FIG. 9 by clocks and measures time.

For example, in the WAKE_SHORT signal, the time T4 is time obtained by adding the known time T3 given by the input pattern for self determination and time determined by the circuit characteristic of the squelch time measuring circuit 21 (35 ns or longer and less than 101.3 ns). When the time T4 becomes longer than that, it means that the circuit characteristic of the squelch time measuring circuit 21 changes, and response time becomes longer and does not meet the standard.

Consequently, the count values of the times T4 to T7 in the case where the response time meets the standard are pre-stored in the comparison count value register 151. By comparing the count value in the time measurement count circuit 154 with the value stored in the comparison count value register 151 in the count value comparing circuit 153, whether the response time meets the standard or not is determined. If the response time does not meet the standard, the set value of the characteristic adjustment register 14 is changed to adjust the response time of the squelch time measuring circuit 21.

Concretely, first, in a state where the characteristic adjustment register 14 is set so that the response time of the squelch time measuring circuit 21 becomes the shortest, the input pattern for self determination is supplied from the pattern generating circuit 152 to the squelch time measuring circuit 21.

The times T4 to T7 in the four signals (WAKE_SHORT, WAKE_LONG, INIT_SHORT, and INIT_LONG) output from the squelch time measuring circuit 21 are counted by the time measurement count circuit 154.

In practice, it is unnecessary to count all of the four signals but is sufficient to count the time T5 in the signal WAKE_LONG and the time T7 in the signal INIT_LONG.

The count comparing circuit 153 compares the count result with the value of the comparison count value register 151.

Since the response time of the squelch time measuring circuit 21 is set to the shortest, the count value becomes smaller than the register value. In this case, feedback control is performed in such a manner that the setting of the characteristic adjustment register 14 is changed to increase the response time of the squelch time measuring circuit 21.

The first stage of the response time of the squelch time measuring circuit 21 various among the times T4 to T7 and is, for example, about 3 ns in the time T4, about 8 ns in the time T5, about 12 ns in the time T6, and about 25 ns in the time T7.

As described above, in the case of counting only the time T5 or T7, the characteristic adjustment register 14 is configured so that when the setting in the time T5 is changed by one stage, the setting in the time T4 changes by one stage, and when the setting in the time T7 is changed by one stage, the setting in the time T6 changes by one stage. The configuration of the characteristic adjustment register 14 can be simplified.

After changing the setting of the characteristic adjustment register 14, the pattern for self determination is supplied again to the squelch time measuring circuit 21, counting of the times T5 to T7 in the four signals output from the squelch time measuring circuit 21 and comparison of the count values are repeated, and the changing of the setting is stopped with a register value when the count value exceeds the register value. The response time of the squelch time measuring circuit 21 set by the register value at this time is response time in which the influence of fluctuations in the circuit characteristics is absorbed.

Therefore, by using the set value of the characteristic adjustment register 14 at this time for the normal communication operation, all of the four output signals (WAKE_SHORT, WAKE_LONG, INIT_SHORT, and INIT_LONG) from the squelch time measuring circuit 21 can be set to response time meeting the standard.

As described above, the input pattern for self determination is generated in the OOB generation circuit 100 and is supplied to the squelch time measuring circuit 21 in the time determining circuit 2, and the response time of the squelch time measuring circuit 21 is adjusted by the feedback control. As a result, even in the case where the circuit characteristics of the time determining circuit 2 fluctuate, the response time in which the fluctuations are absorbed can be set.

The example where the set value of the characteristic adjustment register 14 is set so that the response time of the squelch time measuring circuit 21 becomes the shortest and the setting of the characteristic adjustment register 114 is changed step by step has been described. It is also possible to set so that the response time of the squelch time measuring circuit 21 becomes the longest and change the setting of the characteristic adjustment register 14 step by step. It is also possible to set so that the response of the squelch time measuring circuit 21 becomes an intermediate value between the shortest and longest times and change the setting of the characteristic adjustment register 14 step by step.

The squelch interval count circuit 22 in the post stage of the squelch time measuring circuit is a conventional digital circuit for counting that the squelch interval of specific time is input three times or more, and is not the object of self adjustment of the invention. Consequently, the squelch interval count circuit 22 will not be described.

A-3. Effect

As described above, in the OOB detection circuit 100 of the first embodiment of the present invention, by adding the self adjustment mechanism to each of the amplitude determining circuit 1 and the time determining circuit 2, even in the case where a characteristic fluctuation occurs in the amplitude determining circuit 1 and the time determining circuit 2 as analog circuits, a threshold and response time in which the fluctuation is absorbed by feedback control can be set. Therefore, the OOB detection circuit capable of making accurate signal determination and preventing deterioration in the yield of products can be obtained.

Although each of the amplitude determining circuit 1 and the time determining circuit 2 has the self adjustment mechanism in the above description, the self adjustment mechanism may be added to only one of the amplitude determining circuit 1 and the time determining circuit 2. By providing the self adjustment mechanism for one of the circuits, in which the characteristic fluctuation occurs more frequently, an effect similar to the above can be produced.

The self adjustment operation of the OOB detection circuit may be performed on start of operation of an LSI or at a proper timing in the operation.

B. Second Embodiment

In a second embodiment of the present invention, in the SATA system having the OOB detection circuit 100 described in the first embodiment, self adjustment of the amplitude determining circuit 1 and the time determining circuit 2 in the OOB detection circuit 100 is performed. A CPU (Central Processing Unit) recognizes a result of the self adjustment and starts SATA communication.

Figure 10:
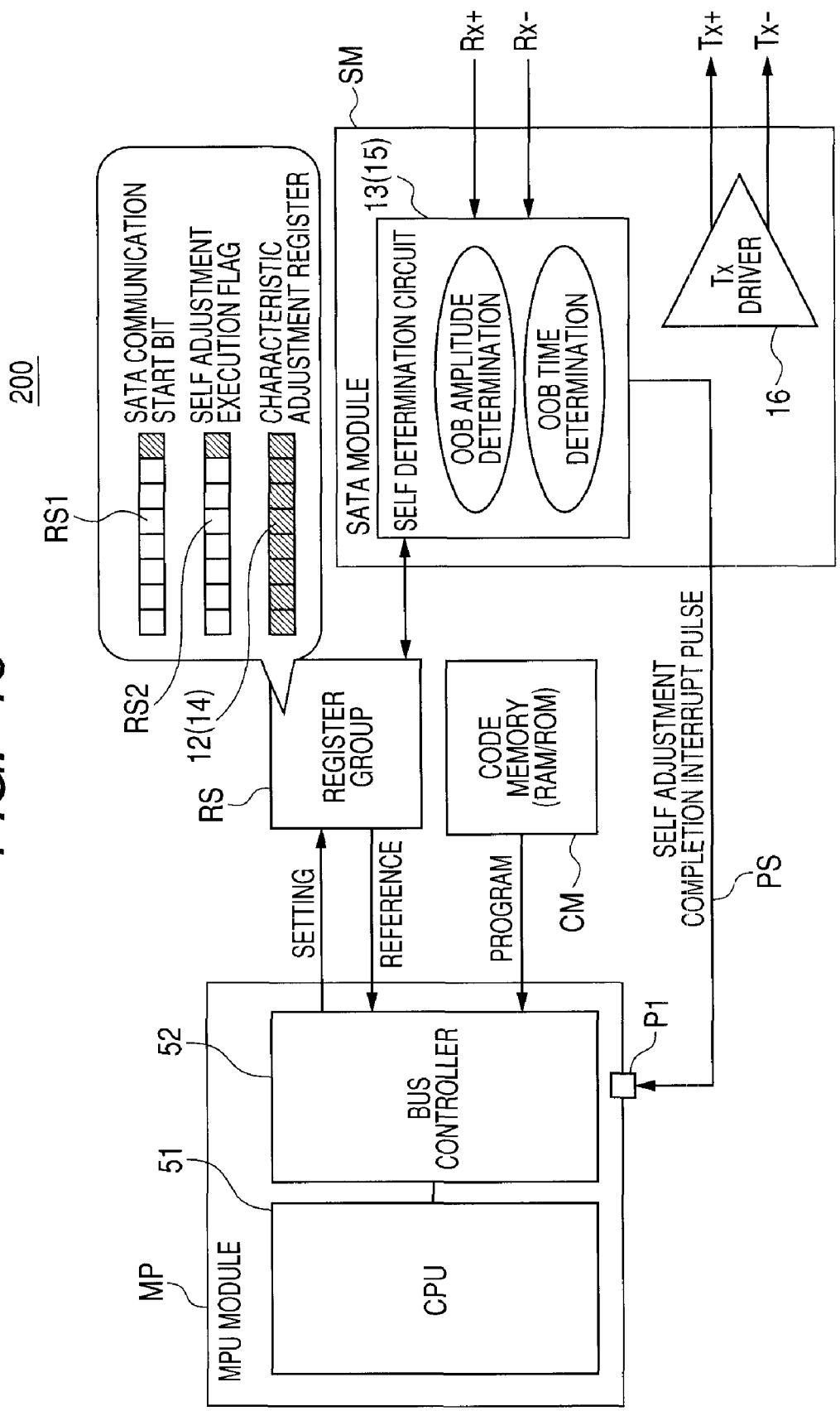
FIG. 10 is a block diagram showing the configuration of an SATA system as a second embodiment of the invention.

FIG. 10 is a block diagram showing the configuration of a microcomputer 200 as an example of an SATA system having the OOB detection circuit 100.

As shown in FIG. 10, the microcomputer 200 has an MPU (Micro Processing Unit) module MP, a register group RS for transmitting/receiving a predetermined set value to/from a CPU 51 via a bus controller 52 in the MPU module MP, a code memory (as a RAM or ROM) CM storing a program for the bus controller 52, and an SATA module SM.

The self determination circuit 13 (15) in the OOB detection circuit 100 described with reference to FIGS. 7 and 8 is included in the SATA module SM, and the self determination circuit 13 (15) and the register group RS are coupled to each other. The register group RS includes an SATA communication start bit register RS1, a self adjustment execution flag register RS2, and the characteristic adjustment registers 12 and 14 shown in FIGS. 7 and 8. These are capable of being accessed from the CPU 51 via the bus controller 52.

In the SATA module SM, a Tx driver 16 for outputting an SATA_Tx signal to the Tx+ port and the Tx− port is shown.

The MPU module MP is provided with an interrupt port P1 for receiving a self adjustment completion interrupt pulse signal PS output from the self determination circuit 13 (15).

Figure 11:
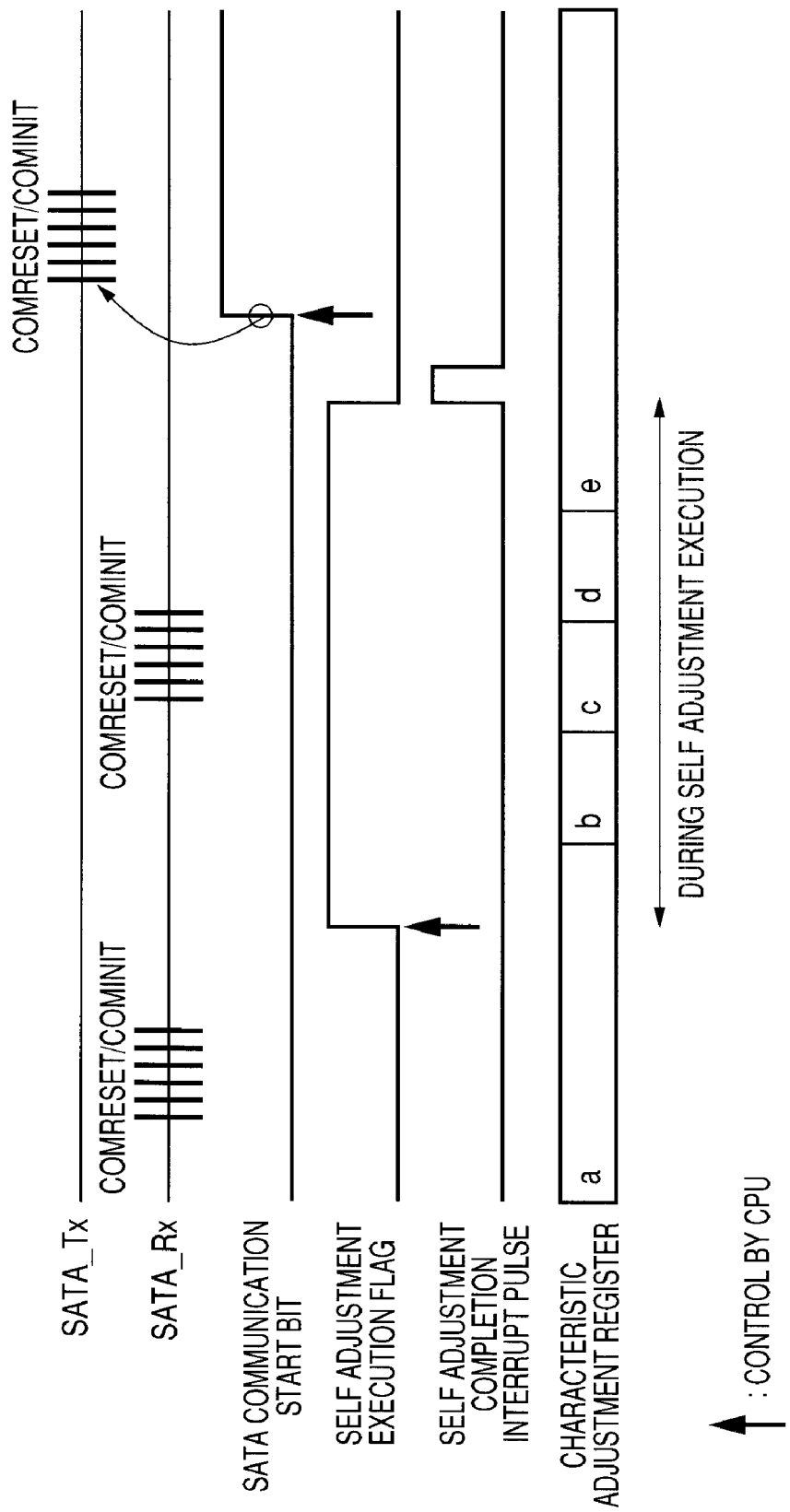
FIG. 11 is a timing chart for explaining the operation of the SATA system as the second embodiment of the invention.

Next, self adjustment result recognizing operation in the microcomputer 200 will be described with reference to FIG. 10 and using a timing chart of FIG. 11.

Until the CPU 51 sets an SATA communication start bit in the SATA communication start bit register RS1, the SATA module SM does not respond even if an SATA_Rx signal is received from the Rx+ port and Rx− port, so that the SATA communication does not start.

On the other hand, when the SATA communication start bit register RS1 is set, the SATA module SM transmits COMRESET/COMINIT as the SATA_Tx signal to the Tx+ port and the Tx− port to start the SATA communication.

Therefore, by executing a self adjustment work before the SATA communication start bit is set in the SATA communication start bit register RS1, the OOB detection circuit 100 can be adjusted before the SATA communication starts.

Specifically, before the SATA communication start bit is set, the CPU 51 sets a self adjustment execution flag in the self adjustment execution flag register RS2 on the basis of the program. The self determination circuits 13 and 15 described with reference to FIGS. 7 and 8 adjust the amplitude determining circuit 1 and the time determining circuit 2, respectively. During execution of self adjustment, the set values in the characteristic adjustment registers 12 and 14 change as the process advances. For example, a set value which is "a" before the self adjustment becomes a set value "b", "c", and "d" and finally becomes a set value "e".

In the self determination circuits 13 and 15, a self adjustment sequence is assembled in a digital circuit. When the sequence reaches the final process, the self adjustment is completed. Consequently, the self determination circuits 13 and 15 automatically clear the self adjustment execution flag in the self adjustment execution flag register RS2 and output the self adjustment completion interrupt pulse PS to the MPU module MP.

After detection of the self adjustment completion interrupt pulse PS, the CPU 51 can recognize the set value "e" of the characteristic adjustment register 12 (14) as a self adjustment result. When it is determined that there is no problem, the CPU 51 sets the SATA communication start bit in the SATA communication start bit register RS1, transmits COMRESET/COMINIT, and starts the SATA communication.

In the case where there is a problem in the adjustment result, the CPU 51 can rewrite the set value of the characteristic adjustment register 12 (14).

As described above, by employing the configuration that the self adjustment of the amplitude determining circuit 1 and the time determining circuit 2 in the OOB detection circuit 100 is performed and the CPU 51 recognizes the self adjustment result and starts the SATA communication, the self adjustment can be performed automatically prior to the SATA communication. Occurrence of a communication error due to a characteristic fluctuation in the amplitude determining circuit 1 and the time determining circuit 2 can be prevented.

C. Third Embodiment

The microcomputer 200 described in the second embodiment employs the configuration that the CPU recognizes the self adjustment result and starts the SATA communication. In a third embodiment, a configuration that the SATA communication can be started without recognition of the self adjustment result by the CPU will be described.

Figure 12:
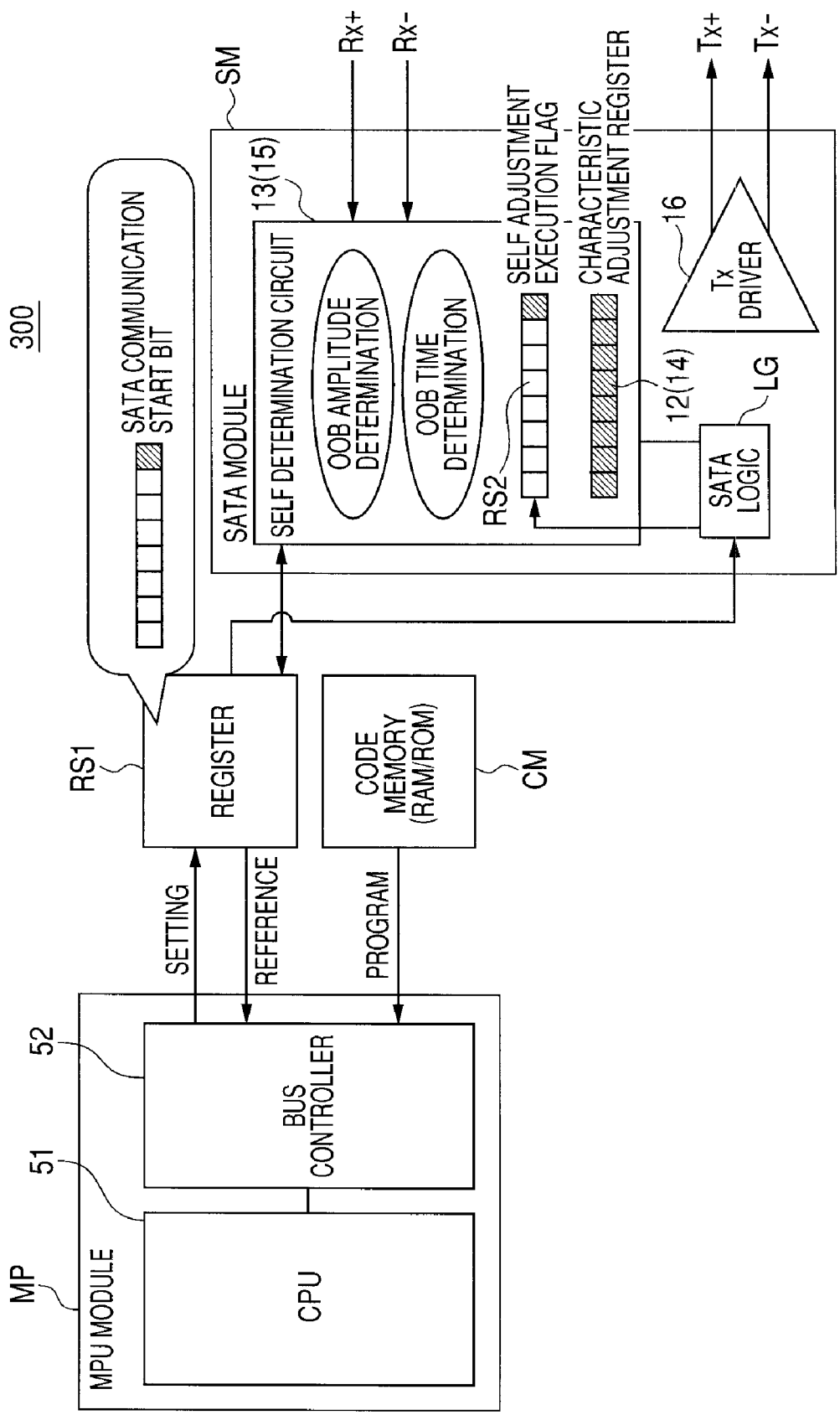
FIG. 12 is a block diagram showing the configuration of an SATA system as a third embodiment of the invention.

FIG. 12 is a block diagram showing the configuration of a microcomputer 300 as a third embodiment. The same reference numerals are designated to the same components as those of the microcomputer 200 shown in FIG. 10 and repetitive description will not be given.

As shown in FIG. 12, the microcomputer 300 has the SATA communication start bit register RS1 as a register which can be accessed from the CPU 51. The self determination circuit 13 (15) in the OOB detection circuit 100 described with reference to FIGS. 7 and 8 has the self adjustment execution flag register RS2 and the characteristic adjustment register 12 (14) shown in FIGS. 7 and 8. The characteristic adjustment register 12 (14) may be provided on the outside of the self determination circuit 13 (15) as shown in FIGS. 7 and 8.

The microcomputer 300 also has an SATA logic circuit LG for setting the self adjustment execution flag in the self adjustment execution flag register RS2 in response to the setting of the CPU 51 to the SATA communication start bit register RS1.

Figure 13:
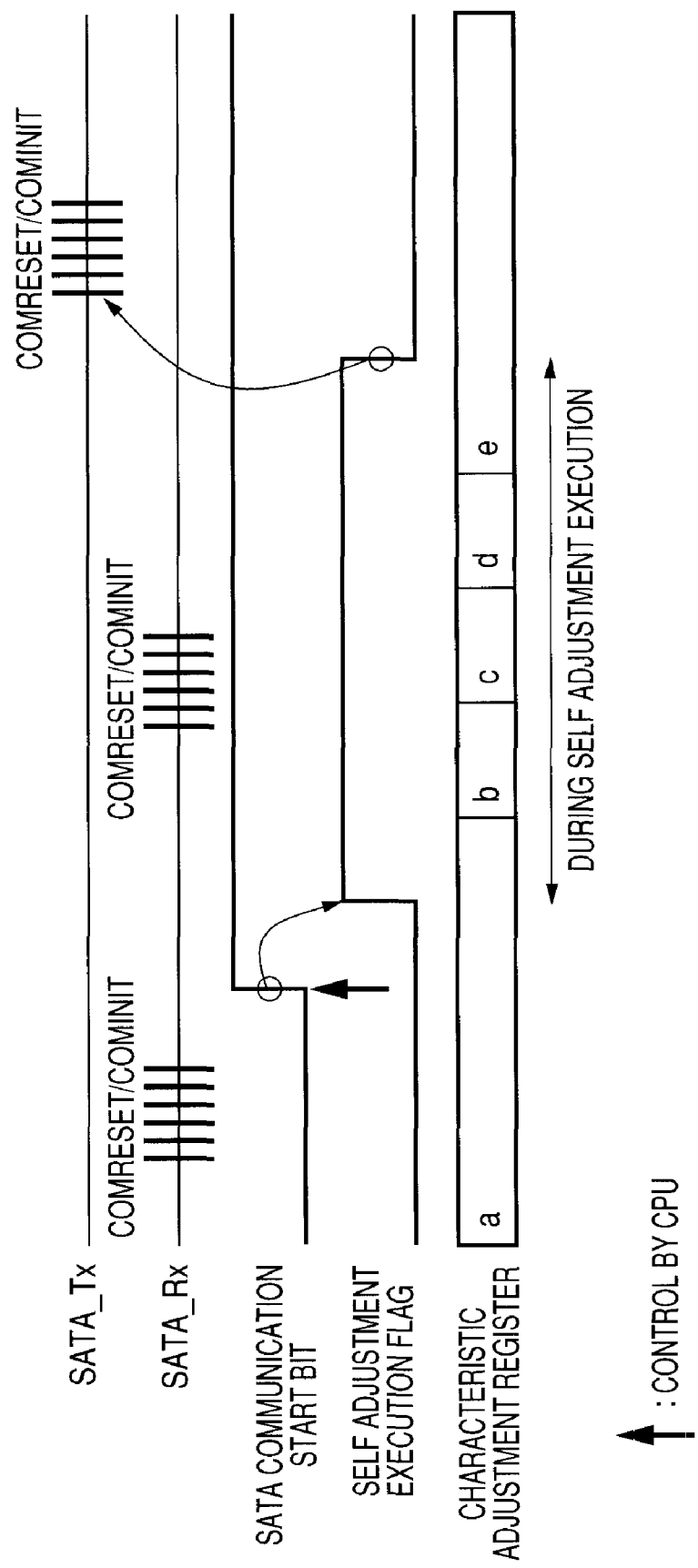
FIG. 13 is a timing chart for explaining the operation of the SATA system as the third embodiment of the invention.

The self adjustment operation of the microcomputer 300 will now be described by using the timing chart of FIG. 13 with reference to FIG. 12.

When the CPU 51 sets the SATA communication start bit in the SATA communication start bit register RS1, the SATA logic circuit LG as hardware automatically sets the self adjustment execution flag in the self adjustment execution flag register RS2. In response to the setting, the self determination circuits 13 and 15 described with reference to FIGS. 7 and 8 adjust the amplitude determining circuit 1 and the time determining circuit 2, respectively. During execution of self adjustment, the set values of the characteristic adjustment registers 12 and 14 change as the process advances. For example, a set value which is "a" before the self adjustment becomes a set value "b", "c", and "d" and finally becomes a set value "e".

Even if an SATA_Rx signal is received from the Rx+ port and the Rx− port, the SATA module SM does not respond to the signal until the self adjustment execution flag of the self adjustment execution flag register RS2 is cleared. Consequently, the SATA communication is not started.

The SATA logic circuit LG has the function of automatically clearing the self adjustment execution flag in the self adjustment execution flag register RS2 in response to end of the self adjustment sequence in the self determination circuits 13 and 15. After clearing the self adjustment execution flag, the SATA logic circuit LG transmits COMRESET/COMINIT as the SATA_Tx signal to the Tx+ port and the Tx− port.

As described above, in the microcomputer 300, after setting the SATA communication start bit, the CPU 51 does not perform the self adjustment work. During a predetermined period, the CPU 51 determines the end of the self adjustment work in the SATA module SM and starts the SATA communication as soon as the self adjustment is finished. The program stored in the code memory CM does not have to include a program related to the self adjustment work, so that it is earlier for the user to develop a program.

What is claimed is:

1. An OOB (out of band) detection circuit for detecting an OOB pattern in serial ATA (Advanced Technology Attachment),
   wherein at least one of an amplitude determining circuit for determining a squelch interval and a burst interval in the OOB pattern and a time determining circuit for determining time of the squelch interval comprises:
      a self adjustment mechanism having an adjustment mechanism for adjusting a circuit characteristic of at least one of said amplitude determining circuit and said time determining circuit; and
      a feedback mechanism for detecting an output of the adjustment mechanism and controlling the adjustment mechanism.

2. The OOB detection circuit according to claim 1, wherein the self adjustment mechanism is provided for the amplitude determining circuit,
   wherein a DC amplitude generating circuit is provided for supplying, in a self adjustment operation, a differential signal of DC voltage in place of an input signal in normal communication operation to the amplitude determining circuit,
   wherein the adjustment mechanism includes a register that stores data for adjusting a threshold of amplitude determination in the amplitude determining circuit, and
   wherein the feedback mechanism changes the data in the register to change the threshold in a state where the DC voltage differential signal is supplied to the amplitude determining circuit, receives an output of the amplitude determining circuit for each threshold and, when a state of the output changes, fixes the data in the register.

3. The OOB detection circuit according to claim 1,
   wherein the self adjustment mechanism is provided for the time determining circuit,
   wherein the self adjustment mechanism is provided in the time determining circuit and includes a register that stores data for adjusting response time in a squelch time measuring circuit for measuring the time of the squelch interval,
   wherein the feedback mechanism comprises:
      a pattern generating circuit for, in self adjustment operation, generating a pulse pattern having a known first period in which potential is at a low or high level in place of an input signal in a normal communication operation and supplying the pulse pattern to the time determining circuit;
      a time measuring circuit for receiving an output signal of the squelch time measuring circuit and measuring a second period of the same potential as that of the first period obtained by adding the first period of the pulse pattern with response time determined by a circuit characteristic of the squelch time measuring circuit; and
      a comparison circuit for comparing the second period measured by the time measuring circuit with a predetermined standard value that meets a standard of the serial ATA, and
   wherein when the second period does not meet the standard value, the data in the register is changed to adjust the response time and, when the second period meets the standard value, the data in the register is fixed.

4. A serial ATA system comprising an OOB detection circuit of claim 1,
   wherein an arithmetic processing unit controls self adjustment operation in the self adjustment mechanism, recognizes end of the self adjustment operation, and starts normal communication operation.

5. A serial ATA system comprising the OOB detection circuit of claim 1,
   wherein after an arithmetic processing unit sets a start bit in a communication start bit register, the self adjustment mechanism executes a self adjustment operation and, by recognizing completion of the self adjustment operation, a normal communication operation is started.

* * * * *